US012191385B2

(12) United States Patent
Finney et al.

(10) Patent No.: US 12,191,385 B2
(45) Date of Patent: Jan. 7, 2025

(54) SEMICONDUCTOR DEVICE HAVING A CURRENT SPREADING REGION

(71) Applicant: Infineon Technologies Austria AG, Villach (AT)

(72) Inventors: Adrian Finney, Villach (AT); Harsh Naik, El Segundo, CA (US); Ingmar Neumann, Villach (AT)

(73) Assignee: Infineon Technologies Austria AG, Villach (AT)

( * ) Notice: Subject to any disclaimer, the term of this patent is extended or adjusted under 35 U.S.C. 154(b) by 387 days.

(21) Appl. No.: 17/669,831

(22) Filed: Feb. 11, 2022

(65) Prior Publication Data
US 2023/0261104 A1 Aug. 17, 2023

(51) Int. Cl.
*H01L 29/78* (2006.01)
*H01L 29/40* (2006.01)
*H01L 29/423* (2006.01)
*H01L 29/66* (2006.01)

(52) U.S. Cl.
CPC ........ *H01L 29/7813* (2013.01); *H01L 29/401* (2013.01); *H01L 29/407* (2013.01); *H01L 29/42368* (2013.01); *H01L 29/66734* (2013.01); *H01L 29/7811* (2013.01)

(58) Field of Classification Search
CPC . H01L 29/7813; H01L 29/401; H01L 29/407; H01L 29/42368; H01L 29/66734; H01L 29/7811; H01L 29/0623; H01L 29/0696; H01L 29/0878; H01L 29/404; H01L 29/0684; H01L 29/4236; H01L 29/66666; H01L 29/7827
See application file for complete search history.

(56) References Cited

U.S. PATENT DOCUMENTS

| 5,929,481 A | 7/1999 | Hsieh et al. |
| 8,105,903 B2 | 1/2012 | Hsieh |
| 9,368,614 B2 | 6/2016 | Hébert |
| 2013/0113038 A1 | 5/2013 | Hsieh |
| 2017/0110573 A1 | 4/2017 | Laforet et al. |
| 2023/0261104 A1* | 8/2023 | Finney .................. H01L 29/407 257/288 |

OTHER PUBLICATIONS

Williams, Richard K., et al., "The Trench Power MOSFET: Part I—History, Technology, and Prospects", IEEE Transactions on Electron Devices, vol. 64, No. 3, Mar. 2017, pp. 674-691.

* cited by examiner

*Primary Examiner* — Jack S Chen
(74) *Attorney, Agent, or Firm* — Murphy, Bilak & Homiller, PLLC

(57) ABSTRACT

A semiconductor device includes: a semiconductor substrate; a drift zone of a first conductivity type in the semiconductor substrate; an array of interconnected gate trenches extending from a first surface of the semiconductor substrate into the drift zone; a plurality of semiconductor mesas delimited by the array of interconnected gate trenches; a plurality of needle-shaped field plate trenches extending from the first surface into the plurality of semiconductor mesas; in the plurality of semiconductor mesas, a source region of the first conductivity type and a body region of a second conductivity type separating the source region from the drift zone; and a current spreading region of the first conductivity type at the bottom of the gate trenches and having a higher average doping concentration than the drift zone. Methods of producing the semiconductor device are also described.

7 Claims, 4 Drawing Sheets

SEMICONDUCTOR DEVICE HAVING A CURRENT SPREADING REGION

BACKGROUND

Power semiconductor devices that have gate trenches separate from field plate trenches are faced with a fundamental trade-off between area specific on resistance (Rdson) and gate-to-drain charge (Qgd) of the device. A key factor for this trade-off is the bottom part of the gate trench within the drift region and which is not shielded by the body region. This part of the gate trench contributes heavily to both Rdson and Qgd. When a voltage is applied to the gate to switch on the device, an inversion region is created within the body region of the device. In the drift region below the body region, an accumulation region arises in response to the gate voltage instead of an inversion region.

Since the accumulation region is part of the drift region, the doping of the accumulation region is relatively low compared to the source and body regions of the device. At the same time, the current conducted through the device preferably spreads away from the gate trench so that the whole silicon area can be used for conduction, which can be seen as a contribution to the overall Rdson resistance of the device. If the gate trench is structured deeper into the drift region of the device, the correspondingly larger charge accumulation helps to significantly reduce the spreading resistance. However, Qgd is higher for a deeper gate trench.

The trade-off between Rdson and Qgd requires a careful evaluation based on the application requirements for each voltage class of interest. For example, either switching may be optimized with a low Qgd at the expense of higher Rdson, or Rdson may be optimized with a low Rdson at the expense of higher Qgd. Based on the desired technology direction, both the gate trench depth and oxide thickness at the bottom of the gate trench may require adjustment to satisfy Rdson and Qgd requirements. For a lower Rdson but higher Qgd, the gate trench should be relatively deep with respect to the body region. For a lower Qgd but somewhat higher Rdson, the bottom of the gate trench should terminate as close as possible to the body region. Furthermore, varying the oxide thickness at the bottom of the gate trench does not allow for a better optimization of the device as compared to varying the gate trench depth.

Thus, there is a need for a power semiconductor device that improves the trade-off between Rdson and Qgd.

SUMMARY

According to an embodiment of a semiconductor device, the semiconductor device comprises: a semiconductor substrate; a drift zone of a first conductivity type in the semiconductor substrate; an array of interconnected gate trenches extending from a first surface of the semiconductor substrate into the drift zone; a plurality of semiconductor mesas delimited by the array of interconnected gate trenches; a plurality of needle-shaped field plate trenches extending from the first surface into the plurality of semiconductor mesas; in the plurality of semiconductor mesas, a source region of the first conductivity type and a body region of a second conductivity type separating the source region from the drift zone; and a current spreading region of the first conductivity type at the bottom of the gate trenches and having a higher average doping concentration than the drift zone.

According to an embodiment of a method of producing a semiconductor device, the method comprises: forming a drift zone of a first conductivity type in a semiconductor substrate; forming an array of interconnected gate trenches that extends from a first surface of the semiconductor substrate into the drift zone, the array of interconnected gate trenches delimiting a plurality of semiconductor mesas; forming a plurality of needle-shaped field plate trenches extending from the first surface into the plurality of semiconductor mesas; in the plurality of semiconductor mesas, forming a source region of the first conductivity type and a body region of a second conductivity type separating the source region from the drift zone; and forming a current spreading region of the first conductivity type at the bottom of the gate trenches and having a higher average doping concentration than the drift zone.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a semiconductor device that overcomes the trade-off between Rdson and Qgd. The semiconductor device has a trench grid layout that includes an array of interconnected gate trenches extending into a drift zone of a semiconductor substrate and needle-shaped field plate trenches also extending into the semiconductor substrate. Semiconductor mesas are delimited by the array of interconnected gate trenches, and the needle-shaped field plate trenches extends into the semiconductor mesas. The semiconductor device also includes a current spreading region of the same conductivity type as the drift zone, at the bottom of the gate trenches and having a higher average doping concentration than the drift zone.

In combination with the trench grid layout, the current spreading region at the bottom of the gate trenches allows for a considerable reduction of the on-state resistance (Rdson) of the device, due to improved current spreading into the drift region. For example, simulations have shown a reduction in Rdson of up to 13% for a 150V device. Moreover, even though the current spreading region impacts the Qgd performance of the device, the trade-off between Rdson and Qgd is much more favorable as compared to changing the gate trench geometry. Also, the dopant concentration in the current spreading region may be changed much more easily by adjusting the implant dose as compared to adjusting the geometric properties of the gate trench, making it much easier to optimize the device by varying the implant dose used to form the current spreading region.

Described next with reference to the figures are embodiments of the current spreading region and methods of producing a semiconductor device with the current spreading region.

Figure 2:
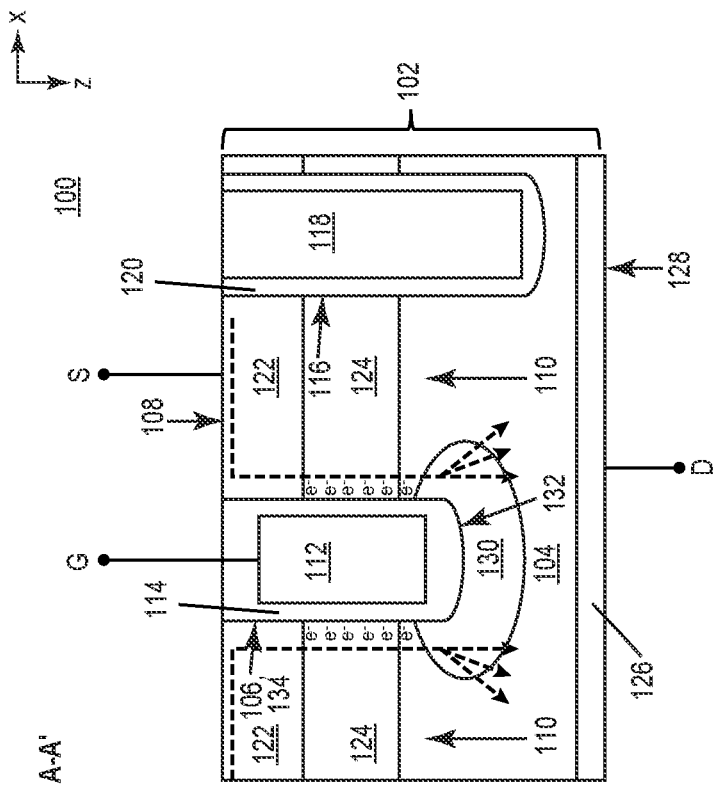
FIG. 2 illustrates a corresponding cross-sectional view of the semiconductor device along the line labelled A'A' in FIG. 1.
Figure 1:
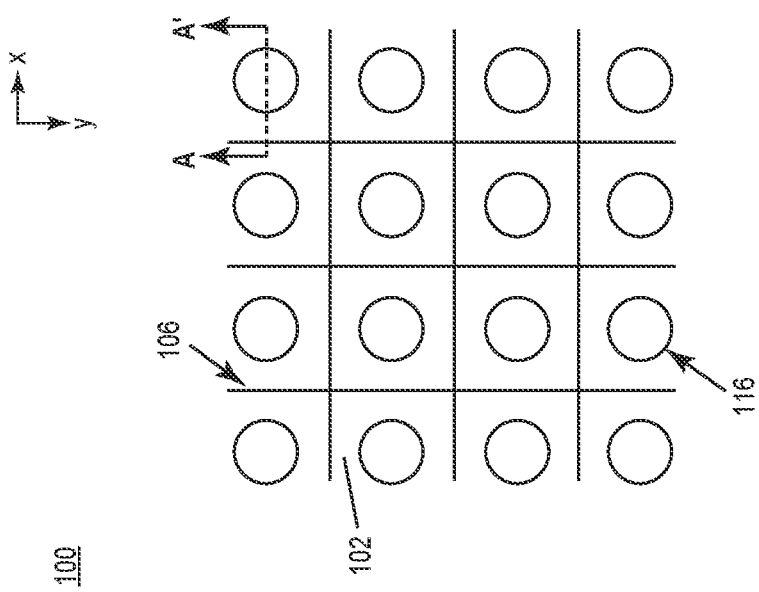
FIG. 1 illustrates a partial top plan view of an embodiment of a semiconductor device having a current spreading region at the bottom of the gate trenches.

FIG. 1 illustrates a partial top plan view of an embodiment of a semiconductor device 100 and FIG. 2 illustrates a corresponding cross-sectional view of the semiconductor device 100 along the line labelled A'A' in FIG. 1. The semiconductor device 100 may be a low voltage power MOSFET having a maximum rated voltage of 60V or below. The semiconductor device 100 instead may be a medium voltage power MOSFET having a maximum rated voltage between 60V and 300V, or a high voltage power MOSFET having a maximum rated voltage greater than 300V. Other device types may utilize the field plate anchoring teachings described herein.

In each case, the semiconductor device 100 includes a semiconductor substrate 102. The semiconductor substrate 102 comprises one or more semiconductor materials that are used to form power semiconductor devices such as, e.g., Si or SiC power MOSFETs. For example, the semiconductor substrate 102 may comprise Si, silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material. In the case of a power transistor device, transistor cells formed in the semiconductor substrate 102 and electrically coupled in parallel to form a power transistor such as, e.g., a Si or SiC power MOSFET. The semiconductor device 100 may have tens, hundreds, thousands, or even more transistors cells.

The semiconductor device 100 also includes a drift zone 104 of a first conductivity type in the semiconductor substrate 102 and an array of interconnected gate trenches 106 extending from a first surface 108 of the semiconductor substrate 102 into the drift zone 104. The gate trenches 106 are 'stripe-shaped' in that the gate trenches 106 have a longest linear dimension in a direction (x and y directions in FIG. 1) that is parallel to the first surface 108 of the semiconductor substrate 102 and transverses the depth-wise direction (z direction in FIG. 2) of the semiconductor substrate 102. The gate trenches 106 delimit semiconductor mesas 110 within the semiconductor substrate 102. That is, the gate trenches 106 laterally define the limits of the semiconductor mesas 110 within the semiconductor substrate 102.

Each gate trench 106 includes a gate electrode 112 and a gate dielectric insulating material 114 that separates the gate electrode 112 from the surrounding semiconductor substrate 102. The gate electrodes 112 are electrically connected to a gate terminal 'G' of the semiconductor device 100 through, e.g., metal gate runners and respective contacts/vias that extend through an interlayer dielectric and which are out of view in FIGS. 1 and 2.

Needle-shaped field plate trenches 116 extend from the first surface 108 into the semiconductor mesas 110 delimited by the gate trenches 106 and are laterally spaced apart from the gate trenches 106. The field plate trenches 116 are 'needle-shaped' in that the field plate trenches 116 are narrow and long in a depth-wise direction (z direction in FIG. 2) of the semiconductor substrate 102 and may resemble a needle, column or spicule in the depth-wise direction of the semiconductor substrate 102. The needle-shaped field plate trenches 116 help optimize the area-specific on-state resistance achievable for a given breakdown voltage, by providing charge carrier compensation.

Each needle-shaped field plate trench 116 includes a field plate 118 and a field dielectric insulating material 120 that separates the field plate 118 from the surrounding semiconductor substrate 102. The field plates 118 and the gate electrodes 112 may be made from any suitable electrically conductive material such as but not limited to polysilicon, metal (e.g., tungsten), metal alloy, etc. The field plates 118 and the gate electrodes 112 may comprise the same or different electrically conductive material. The gate dielectric insulating material 114 may comprise, e.g., SiOx and may be formed by thermal oxidation and/or deposition, for example. The field dielectric insulating material 120 may comprise the same or different material as the gate dielectric insulating material 114 and/or may be thicker than the gate dielectric insulating material 114 at least along the sidewalls of the trenches 106, 116, for example.

Each semiconductor mesa 110 delimited by the array of interconnected gate trenches 106 includes a source region 122 of the first conductivity type and a body region 124 of a second conductivity type separating the source region 122 from the drift zone 104. In the case of a Si or SiC power MOSFET, a drain region 126 adjoins the drift zone 104 at the back surface 128 of the semiconductor substrate 102.

The first conductivity is n-type and the second conductivity type is p-type for an n-channel device whereas the first conductivity is p-type and the second conductivity type is n-type for a p-channel device. For either n-channel or p-channel devices, the source region 122 and the body region 124 included in the same semiconductor mesa 110 may form part of a transistor cell and the transistor cells are electrically connected in parallel between source (S) and drain (D) terminals of the semiconductor device 100 to form a power transistor.

The body regions 124 may include a body contact region (not shown) of the second conductivity type and having a higher doping concentration than the body regions 124, to provide an ohmic connection to the source potential S. The source regions 122 are also at the source potential S. The field plates 118 also may be electrically connected to the source potential S, or to a different potential. Not all field plates 118 need be at the same potential. Some or all field plates 118 may be electrically floating, i.e., not connected to a defined potential.

Regardless of the type of power transistor implemented by the transistor cells, and according to the embodiment illustrated in FIG. 1, the semiconductor device 100 also includes a current spreading region 130 of the first conductivity type at the bottom 132 of the gate trenches 106. The current spreading region 130 has a higher average doping concentration than the drift zone 104. When a sufficient voltage is applied to the gate electrodes 112, an inversion channel arises in the body regions 124 along the gate trench sidewalls 134. For an n-channel device, the inversion channel is formed by electrons as indicated by the 'e-' symbols in FIG. 2. For a p-channel device, the inversion channel is formed by holes. In either case, the current spreading region 130, which is doped more heavily than the drift zone 104, helps spread the current away from the gate trenches 106 so that the whole silicon area can be used for conduction and which in turn lowers Rdson. The current flow path is indicted by dashed lines in FIG. 2. As shown in FIG. 2, the drift zone 104 may separate the current spreading region 130 and the body regions 124 from one another at the sidewalls 134 of the gate trenches 106.

In the case of an n-channel device, both arsenic and phosphorous are possible dopant species for the implant used to form the current spreading region 130 but require different energies and/or doses to avoid excessive penetration of the implant mask (not shown in FIGS. 1 and 2) as well as a suitable implant depth under the gate trenches 106. A sharper body/epitaxy junction results from the addition of the current spreading region 130 at the bottom 132 of the gate trenches 106. The addition of the current spreading region 130 also results in better process control because the corresponding junction and the body length are set by implants rather than being partly set by a less well-controlled epitaxy doping process.

Figure 3C:
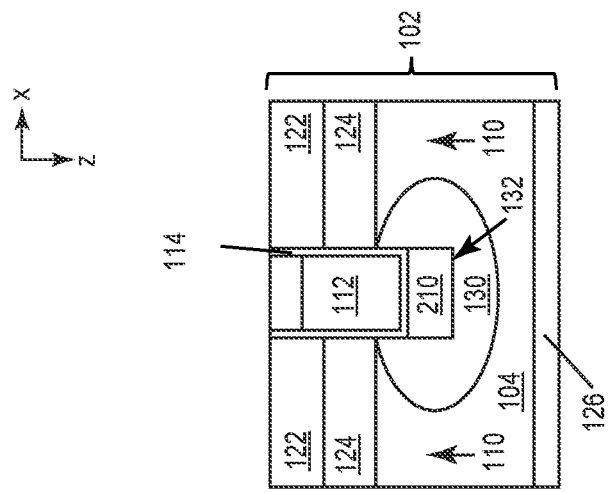
FIGS. 3A through 3C illustrate respective partial cross-sectional views in the region of a transistor cell, of an embodiment of a method of producing the spreading region.
Figure 3B:
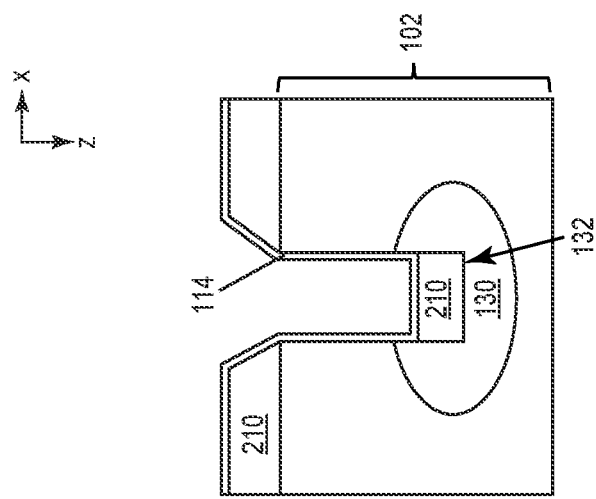
Figure 3A:
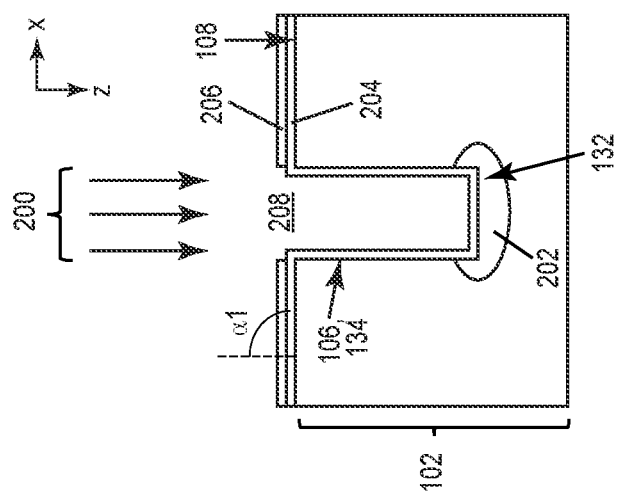

FIGS. 3A through 3C illustrate respective partial cross-sectional views in the region of a transistor cell, of an embodiment of a method of producing the spreading region 130.

FIG. 3A shows implanting a dopant species 200 of the first conductivity type through the gate trenches 106 and into the semiconductor substrate 102, before forming electrodes 112 in the gate trenches 106. For an n-channel Si device, the dopant species 200 may be arsenic or phosphorous. For an p-channel Si device, the dopant species 200 may be boron.

In general, lower implant energies lead to gate trench corner breakdown whereas higher implant energies can be problematic in the termination region of the device 100. In the case of arsenic as the dopant species 200, an implant dose of about 1e12 $cm^{-2}$ and an implant energy in a range of 100 keV to 200 keV may be used to yield a sufficient breakdown behavior at the bottom corners of the gate trenches 106, due to a higher doping in this region, while reducing Rdson by about 8.6%. In the case of phosphorous as the dopant species 200, an implant dose of about 1e12 $cm^{-2}$ and an implant energy of about 50 keV or higher may be used to yield similar breakdown and Rdson behavior as the arsenic implant example.

The breakdown voltage of the device 100 rises with increasing field electrode potential and reaches a maximum value defined as Vfp_max. Rdson is approximately proportional to Vfp such that too high an implant energy for the current spreading region implant reduces Vfp_max. The Rdson improvement gained by the current spreading region implant may be compensated in a way that raises Vfp again to an acceptable level, which depends on the end use application for the device 100.

As shown in FIG. 3A, the dopant species 200 may be implanted at an angle α1 that is perpendicular (90°) with respect to the first surface 108 of the semiconductor substrate 102. The dopant species 200 may be implanted through a sacrificial oxide 204 on the bottom 132 and sidewalls 134 of the gate trenches 106. The dopant species 200 also may be implanted through an implant mask 206 having openings 208 aligned with the gate trenches 106, to minimize the influence of the current spreading region implant outside the region of the gate trenches 106. The implant mask 206 may be a silicon nitride layer, an oxide layer, or a photoresist mask, for example. The implant mask 206 is present on the first surface 108 of the semiconductor substrate 102 during the implanting of the dopant species 200. The implant mask 206 allows for higher implant energy levels without adversely affecting breakdown voltage. In the case of silicon nitride as the implant mask 206, the thickness of the implant mask 204 may be in a range of 70 nm to 100 nm. The sacrificial oxide 204 may have a thickness in a range of 10 nm to 30 nm. The sacrificial oxide 204 and implant mask 206 may be present during gate trench formation. For example, the implant mask 206 also may be used as an etch mask for etching the gate trenches 106 into the semiconductor substrate 102. According to this embodiment, the same mask 206 is used for both gate trench etching and the current spreading region implant.

In general, there is a trade-off between breakdown voltage and Rdson. Rdson can be improved over a range of, e.g., 10 to 20 mOhm with a certain limited impact on breakdown voltage. However, the impact on breakdown voltage may be mitigated by a counter doping implant in the edge termination region (not shown in FIGS. 1 and 2) of the semiconductor device 100. That is, the top part of the semiconductor mesas 110 are heavily doped by the source implant in the active area of the semiconductor device 100. As such, there is no negative impact on the breakdown voltage in the device active area. In the edge termination region where there are no active device cells, any residual doping that results from forming the current spreading region 130 may be compensated by a counter doping implant. For example, a counter doping dose of about 3e11 $cm^{-2}$ and energy of about 400 keV results in the breakdown voltage not being affected. The counter doping may be used independently or in combination with the implant mask 206 to mitigate the effects of the current spreading region implant on breakdown voltage.

FIG. 3B shows the structure after removal of the sacrificial oxide 204 and implant mask 206, and after deposition of a thick bottom oxide 210 in the bottom 132 of the gate trenches 106 and formation of the gate dielectric insulating material 114. The oxide 210 at the bottom 132 of the gate trenches 106 is thicker than the gate dielectric insulating material 114 along the trench sidewalls 134, to provide enhanced electrical field shielding at the bottom corners of the gate trenches 106. For example, the thickness of the thick bottom oxide 210 may be in a range of 100 to 500 nm. In the case of no thick bottom oxide 210 in the bottom 132 of the gate trenches 106, the thickness of the gate dielectric insulating material 114 along the sidewalls 134 and trench bottom 132 may be in a range of 20 to 130 nm, for example.

The gate dielectric insulating material 114 may be formed by an annealing process which leads to diffusion of the current spreading region implant, defining the current spreading region 130. According to the embodiment illustrated in FIGS. 3A through 3C, the current spreading region 130 is formed by implanting the dopant species 200 of the first conductivity type through the gate trenches 106 and into the semiconductor substrate 102 before increasing the thickness of the oxide 210 at the bottom 132 of the gate trenches 106.

FIG. 3C shows the structure after formation of the source and body regions 122, 124 in the semiconductor mesas 110 delimited by the array of interconnected gate trenches 106, and after formation of the gate electrodes 112. As shown in FIG. 3C, the current spreading region 130 and the body regions 124 may adjoin one another at the sidewalls 134 of the gate trenches 106. Alternatively, the drift zone 104 may separate the current spreading region 130 and the body regions 124 from one another at the sidewalls 134 of the gate trenches 106, e.g., as shown in FIG. 2.

Figure 4:
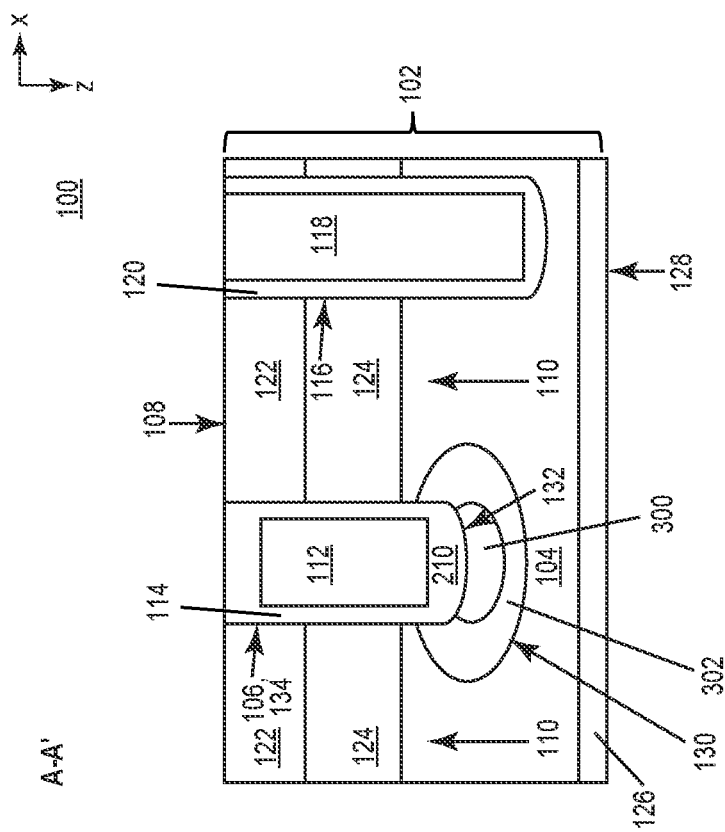

FIG. 4 illustrates a cross-sectional view of the semiconductor device 100 along the line labelled A'A' in FIG. 1, according to another embodiment. According to the embodiment illustrated in FIG. 4, the current spreading region 130 is formed by implanting the dopant species 200 of the first conductivity type through the gate trenches 106 and into the semiconductor substrate 102 after increasing the thickness of the oxide 210 at the bottom 132 of the gate trenches 106. Different than what is shown in FIGS. 3A and 3B, the thick bottom oxide 210 is deposited in the bottom 132 of the gate trenches 106 before implanting the dopant species 200 that forms the current spreading region 130. In this embodiment, the current spreading region 130 has a first region 300 with lower average doping concentration below the bottom 132 of the gate trenches 106 and a second region 302 with higher average doping concentration laterally beyond the bottom 132 of the gate trenches 106. The thick bottom oxide 210 blocks some of the current spreading region implant, resulting in the lower average doping concentration region 300 below the bottom 132 of the gate trenches 106.

Figure 5:
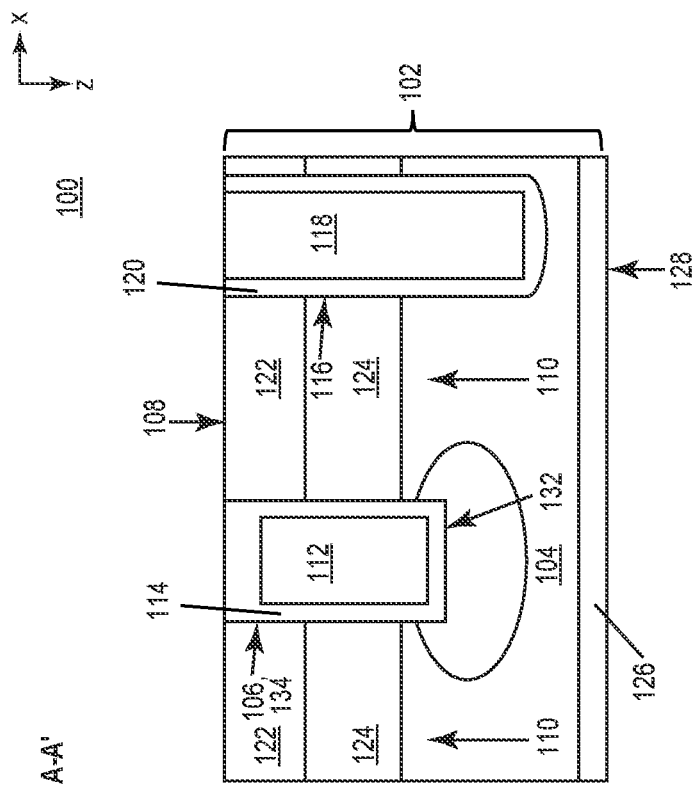
FIGS. 4 through 7 illustrate respective cross-sectional views of the semiconductor device along the line labelled A'A' in FIG. 1, according to further embodiments.

FIG. 5 illustrates a cross-sectional view of the semiconductor device 100 along the line labelled A'A' in FIG. 1, according to another embodiment. According to the embodiment illustrated in FIG. 5, the gate dielectric insulating material 114 in the gate trenches 106 has a generally uniform thickness along the bottom 132 and sidewalls 134 of the gate trenches 106. Different than what is shown in FIGS. 3A through 3B and FIG. 4, a thick bottom oxide 210 is not deposited in the bottom 132 of the gate trenches 106 before or after implanting the dopant species 200 that forms the current spreading region 130. Omitting the thick bottom oxide 210 from the bottom 132 of the gate trenches 106 enables more charge carriers to accumulate at the bottom 132 of the gate trenches 106, improving the device on-state resistance (Rdson*Area) at the expense of a higher Qgd which is better suited to applications requiring low switching frequencies such as drives. Since the current spreading region implant increases the doping at the bottom 132 of the gate trenches 106, a shallower gate trench depth may be used which yields even greater relative improvement in Rdson*area. Such a structure also has the advantage of a lower Qgd.

Figure 6:
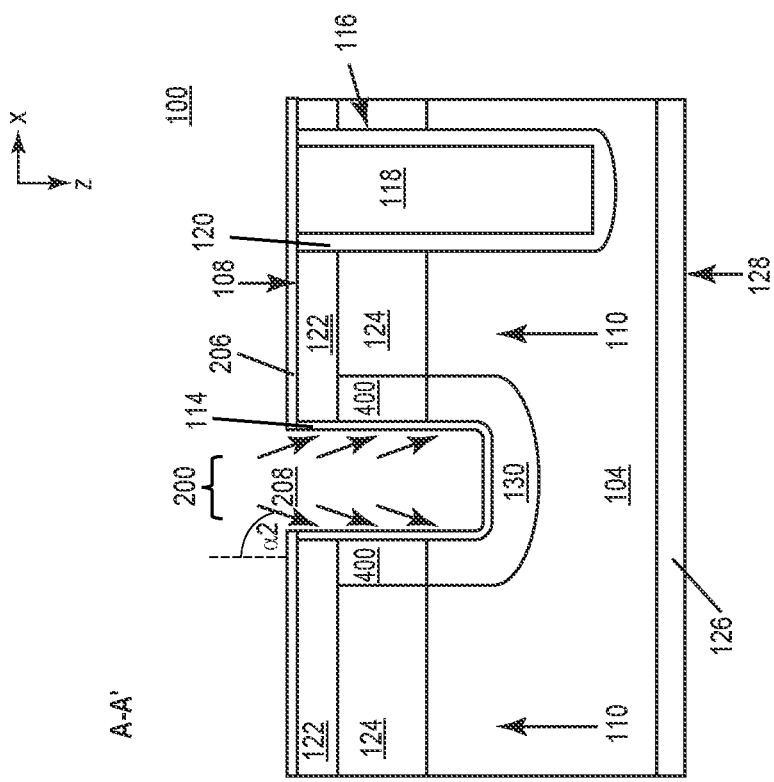

FIG. 6 illustrates another embodiment of a method of producing the spreading region 130, in the region of one transistor cell. According to this embodiment, the dopant species 200 of the first conductivity type is implanted at an angle α2 that is less than 90° with respect to the first surface 108 of the semiconductor substrate 102 such that a larger proportion of the implant penetrates the gate trench sidewalls 134. In one embodiment, the implant angle α2 is in a range of 70° to 80°.

The angled implant may be implemented using a quad angle halo implant where the total dose is delivered in 4 (four) rotational steps of 90° each. In one embodiment, the dopant species 200 of the first conductivity type is implanted into each sidewall 134 of the gate trenches 106 at the same angle α2. However, the implant angle α2 may be varied for different gate trench sidewalls 134. The dose range for the body implant may be higher in the case of an angled implant as compared to the body implant dose range without the angled implant.

The angled implant of the first conductivity type counter-dopes the body regions 124 of the second conductivity type 124 along the sidewalls 134 of the gate trenches 106 which results in a more lightly doped region 400 along the sidewalls 134 of the gate trenches 103. The more lightly doped region 400 along the gate trench sidewalls 134 reduces the threshold voltage of the device 100. According to this embodiment, for the same threshold voltage a heavier body doping which is not counter-doped further away from the gate trenches 106 is provided. This means that a heavier body doping is realized further away from the gate and device channel. The heavier body doping reduces the lateral base resistance of a vertical parasitic NPN (for an n-channel device) and thus improves the snapback current of the device 100 in avalanche by helping to prevent a second breakdown of the parasitic NPN. In this case, the same current spreading region implant dopes both the sidewalls 134 and the bottom 132 of the gate trenches 106. By using an angled implant to form the current spreading region 130, the same threshold voltage Vth can be achieved with a higher body dose which in turn helps to suppress parasitic bipolar snapback of the vertical parasitic NPN.

In one embodiment, a baseline dose for the body regions 124 is associated with forming the current spreading region 130 by implanting the dopant species 200 of the first conductivity type at an angle α1 that is perpendicular with respect to the first surface 108 of the semiconductor substrate 102, as shown in FIG. 3A. Such a perpendicular current spreading region implant has little to no penetration into the body regions 124. However, the angled implant shown in FIG. 6 penetrates the body regions 124 and therefore affects the body region doping concentration, as explained above. To counter this effect, the implantation dose used to form the body regions 124 is increased from the baseline dose that assumes a perpendicular current spreading region implant.

As shown in FIG. 6, the dopant species 200 of the first conductivity type may be implanted through the gate trenches 106 and into the semiconductor substrate 102 after increasing the thickness of the oxide 210 at the bottom 132 of the gate trenches 106. Performing the angled current spreading region implant after depositing the thick bottom oxide 210 ensures sidewall implant ions cannot scatter into the trench bottom 132 to improve decoupling. As explained above in connection with FIG. 5, after thermal processing this results in the current spreading region 130 having a lower average doping concentration region 300 below the bottom 132 of the gate trenches 106 and a higher average doping concentration region laterally beyond the bottom 132 of the gate trenches 106 at the trench sidewalls 134.

Figure 7:
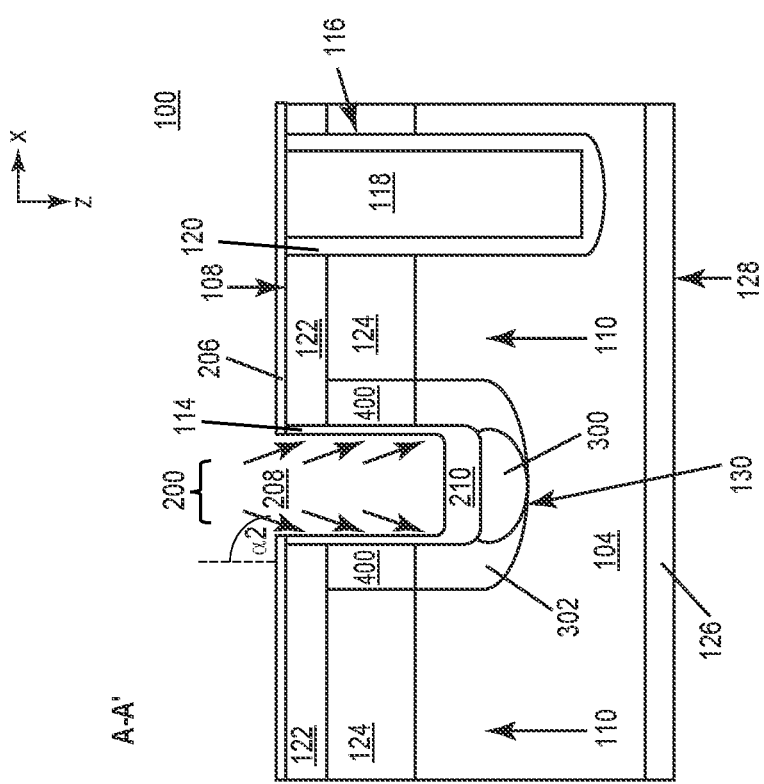

FIG. 7 illustrates another embodiment of a method of producing the spreading region 130, in the region of one transistor cell. The embodiment illustrated in FIG. 7 is similar to the embodiment illustrated in FIG. 6. In FIG. 7, the gate dielectric insulating material 114 in the gate trenches 106 has a generally uniform thickness along the bottom 132 and sidewalls 134 of the gate trenches 106. According to this embodiment, a thick bottom oxide 210 is not deposited in the bottom 132 of the gate trenches 106 before or after the angled current spreading region implant.

FIG. 3A illustrates a perpendicular implant used to form the spreading region 130 whereas FIGS. 6 and 7 illustrate an angled implant relative to the first surface 108 of the semiconductor substrate 102. In another embodiment, both a perpendicular implant and an angled implant may be used to form the spreading region 130, with or without the thick bottom oxide 210 in the bottom 132 of the gate trenches 106. In one embodiment, the current spreading region is formed by a first implantation process and a second implantation process.

The first implantation process includes implanting the dopant species 200 of the first conductivity type through the gate trenches 106 and into the semiconductor substrate 102 at a first angle α1 that is perpendicular with respect to the first surface 108 of the semiconductor substrate 102, e.g., as shown in FIG. 3A. The second implantation process includes implanting the dopant species 200 of the first conductivity type through the gate trenches 106 and into the semiconductor substrate 102 at a second angle α2 that is less than 90° with respect to the first surface 108 of the semiconductor substrate 102, e.g., as shown in FIG. 6 or FIG. 7.

The first implantation process may be performed before the second implantation process, after the second implantation process, or concurrently with the second implantation process. In the case of performing the first implantation process before the second implantation process, the thickness of the oxide at the bottom 132 of the gate trenches 106 may be increased after the first implantation process but before the second implantation process. This way, the thick bottom oxide 210 is present in the bottom 132 of the gate trenches 106 during the angled current spreading region implant.

As explained above, the current spreading region embodiments described herein improve the trade-off between Rdson and Qgd. Furthermore, the trade-off between Rdson and Qgd is more favorable than the trade-off found by varying either the gate trench depth or the oxide thickness at the bottom 132 of the gate trenches 106. The current spreading region 130 allows for a reduction of Rdson while Qgd rises less compared to varying the gate trench depth or bottom oxide thickness to optimize Rdson. An overall Rdson reduction of up to 13 percent has been observed with simulations, by including the current spreading region 130 at the bottom 132 of the gate trenches 106.

Although the present disclosure is not so limited, the following numbered examples demonstrate one or more aspects of the disclosure.

Example 1. A semiconductor device, comprising: a semiconductor substrate; a drift zone of a first conductivity type in the semiconductor substrate; an array of interconnected gate trenches extending from a first surface of the semiconductor substrate into the drift zone; a plurality of semiconductor mesas delimited by the array of interconnected gate trenches; a plurality of needle-shaped field plate trenches extending from the first surface into the plurality of semiconductor mesas; in the plurality of semiconductor mesas, a source region of the first conductivity type and a body region of a second conductivity type separating the source region from the drift zone; and a current spreading region of the first conductivity type at the bottom of the gate trenches and having a higher average doping concentration than the drift zone.

Example 2. The semiconductor device of example 1, wherein the gate trenches each include an electrode and a gate dielectric insulating material separating the electrode from the semiconductor substrate.

Example 3. The semiconductor device of example 2, wherein the gate dielectric insulating material has an increased thickness at a bottom of the gate trenches.

Example 4. The semiconductor device of example 3, wherein the current spreading region has a lower average doping concentration below the bottom of the gate trenches and a higher average doping concentration laterally beyond the bottom of the gate trenches.

Example 5. The semiconductor device of example 2, wherein the gate dielectric insulating material has a generally uniform thickness along a bottom and sidewalls of the gate trenches.

Example 6. The semiconductor device of any of examples 1 through 5, wherein the current spreading region and the body regions adjoin one another at sidewalls of the gate trenches.

Example 7. The semiconductor device of any of examples 1 through 6, wherein the drift zone separates the current spreading region and the body regions from one another at sidewalls of the gate trenches.

Example 8. A method of producing a semiconductor device, the method comprising: forming a drift zone of a first conductivity type in a semiconductor substrate; forming an array of interconnected gate trenches that extends from a first surface of the semiconductor substrate into the drift zone, the array of interconnected gate trenches delimiting a plurality of semiconductor mesas; forming a plurality of needle-shaped field plate trenches extending from the first surface into the plurality of semiconductor mesas; in the plurality of semiconductor mesas, forming a source region of the first conductivity type and a body region of a second conductivity type separating the source region from the drift zone; and forming a current spreading region of the first conductivity type at the bottom of the gate trenches and having a higher average doping concentration than the drift zone.

Example 9. The method of example 8, wherein forming the current spreading region comprises: implanting a dopant species of the first conductivity type through the gate trenches and into the semiconductor substrate, before forming electrodes in the gate trenches.

Example 10. The method of example 9, wherein the dopant species of the first conductivity type is implanted at an angle that is perpendicular with respect to the first surface of the semiconductor substrate.

Example 11. The method of example 9, wherein the dopant species of the first conductivity type is implanted at an angle that is less than 90° with respect to the first surface of the semiconductor substrate.

Example 12. The method of example 11, wherein the angle is in a range of 60° to 80°.

Example 13. The method of example 11 or 12, wherein the dopant species of the first conductivity type is implanted into each sidewall of the gate trenches at the same angle.

Example 14. The method of any of examples 11 through 13, further comprising: increasing, from a baseline dose, an implantation dose used to form the body regions, wherein the baseline dose is associated with forming the current spreading region by implanting the dopant species of the first conductivity type at an angle that is perpendicular with respect to the first surface of the semiconductor substrate.

Example 15. The method of any of examples 9 through 14, further comprising: prior to implanting the dopant species of the first conductivity type, forming a silicon nitride layer, an oxide layer, or a photoresist mask on the first surface of the semiconductor substrate, wherein the silicon nitride layer, oxide layer, or photoresist mask is present on the first surface of the semiconductor substrate during the implanting of the dopant species of the first conductivity type.

Example 16. The method of any of examples 8 through 15, further comprising: increasing a thickness of an oxide at a bottom of the gate trenches.

Example 17. The method of example 16, wherein forming the current spreading region comprises: implanting a dopant species of the first conductivity type through the gate trenches and into the semiconductor substrate, after increasing the thickness of the oxide at the bottom of the gate trenches.

Example 18. The method of example 16, wherein forming the current spreading region comprises: implanting a dopant species of the first conductivity type through the gate trenches and into the semiconductor substrate, before increasing the thickness of the oxide at the bottom of the gate trenches.

Example 19. The method of any of examples 8 through 18, wherein forming the current spreading region comprises: a first implantation process, including implanting a dopant species of the first conductivity type through the gate trenches and into the semiconductor substrate at a first angle that is perpendicular with respect to the first surface of the semiconductor substrate; and a second implantation process, including implanting a dopant species of the first conductivity type through the gate trenches and into the semiconductor substrate at a second angle that is less than 90° with respect to the first surface of the semiconductor substrate.

Example 20. The method of example 19, further comprising: after the first implantation process but before the second implantation process, increasing a thickness of an oxide at a bottom of the gate trenches.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor substrate;
   a drift zone of a first conductivity type in the semiconductor substrate;
   an array of interconnected gate trenches extending from a first surface of the semiconductor substrate into the drift zone;
   a plurality of semiconductor mesas delimited by the array of interconnected gate trenches;
   a plurality of needle-shaped field plate trenches extending from the first surface into the plurality of semiconductor mesas;
   in the plurality of semiconductor mesas, a source region of the first conductivity type and a body region of a second conductivity type separating the source region from the drift zone; and
   a current spreading region of the first conductivity type at the bottom of the gate trenches and having a higher average doping concentration than the drift zone.

2. The semiconductor device of claim 1, wherein the gate trenches each include an electrode and a gate dielectric insulating material separating the electrode from the semiconductor substrate.

3. The semiconductor device of claim 2, wherein the gate dielectric insulating material has an increased thickness at a bottom of the gate trenches.

4. The semiconductor device of claim 3, wherein the current spreading region has a lower average doping concentration below the bottom of the gate trenches and a higher average doping concentration laterally beyond the bottom of the gate trenches.

5. The semiconductor device of claim 2, wherein the gate dielectric insulating material has a generally uniform thickness along a bottom and sidewalls of the gate trenches.

6. The semiconductor device of claim 1, wherein the current spreading region and the body regions adjoin one another at sidewalls of the gate trenches.

7. The semiconductor device of claim 1, wherein the drift zone separates the current spreading region and the body regions from one another at sidewalls of the gate trenches.

* * * * *